(12) United States Patent
Hori et al.

(10) Patent No.: US 7,796,668 B2
(45) Date of Patent: Sep. 14, 2010

(54) VERTICAL CAVITY SURFACE EMITTING LASER

(75) Inventors: Yuichiro Hori, Kawasaki (JP); Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 93 days.

(21) Appl. No.: 12/365,214

(22) Filed: Feb. 4, 2009

(65) Prior Publication Data

US 2009/0196319 A1  Aug. 6, 2009

(30) Foreign Application Priority Data

Feb. 6, 2008  (JP) ............................. 2008-025995

(51) Int. Cl.
*H01S 5/00* (2006.01)

(52) U.S. Cl. .............................. 372/50.124; 372/46.01

(58) Field of Classification Search .................. 372/99, 372/50.124, 50.12, 46.01
See application file for complete search history.

(56) References Cited

U.S. PATENT DOCUMENTS

| | | | |
|---|---|---|---|
| 6,055,262 A * | 4/2000 | Cox et al. ...................... 372/96 |
| 6,154,480 A * | 11/2000 | Magnusson et al. ........... 372/96 |
| 7,295,745 B2 | 11/2007 | Uchida ........................ 385/129 |
| 7,535,946 B2 | 5/2009 | Nagatomo et al. ...... 372/50.124 |
| 7,539,226 B2 | 5/2009 | Uchida ..................... 372/43.01 |
| 7,697,586 B2 * | 4/2010 | Ikuta ....................... 372/50.124 |
| 2006/0245464 A1* | 11/2006 | Hori et al. ..................... 372/99 |
| 2007/0201526 A1 | 8/2007 | Hori ....................... 372/50.124 |
| 2007/0201527 A1 | 8/2007 | Hori et al. .............. 372/50.124 |
| 2008/0107145 A1* | 5/2008 | Hori et al. ..................... 372/99 |
| 2008/0205462 A1 | 8/2008 | Uchida ........................ 372/34 |
| 2008/0285608 A1 | 11/2008 | Hori ...................... 372/44.011 |
| 2008/0304532 A1 | 12/2008 | Uchida ................. 372/50.124 |
| 2009/0010297 A1 | 1/2009 | Uchida ................. 372/50.124 |
| 2009/0074026 A1 | 3/2009 | Nagatomo et al. ..... 372/50.124 |
| 2009/0080489 A1 | 3/2009 | Uchida et al. ......... 372/50.124 |
| 2009/0135872 A1 | 5/2009 | Uchida et al. ............ 372/44.01 |
| 2009/0135876 A1 | 5/2009 | Takeuchi et al. ......... 372/50.11 |
| 2009/0196318 A1 | 8/2009 | Uchida .................... 372/45.01 |

FOREIGN PATENT DOCUMENTS

JP  2006-073823 A  3/2006

OTHER PUBLICATIONS

M.C.Y. Huang et al., "A surface-emitting laser incorporating a high-index-contrast subwavelength grating," Nature Photonics, vol. 1, pp. 119-122, Feb. 2007(with associated Erratum published in Nature Photonics at vol. 1, p. 297, May 2007).
Miyai et al., "Lasers producing tailored beams," Nature, vol. 441, p. 946, Jun. 22, 2006.
Witjaksono et al., "Single-lobe, surface-normal beam surface emission from second-order distributed feedback lasers with half-wave grating phase shift," Applied Physics Letters, vol. 83, No. 26, pp. 5365-5367, Dec. 29, 2003.

* cited by examiner

*Primary Examiner*—Minsun Harvey
*Assistant Examiner*—Tuan N. Nguyen
(74) *Attorney, Agent, or Firm*—Fitzpatrick, Cella, Harper & Scinto

(57) ABSTRACT

A vertical cavity surface emitting laser is provided which controls the reflectivity at the middle portion and the peripheral portion of the mirror with a simple structure to cause oscillation of a single lateral mode by use of a mirror having the refractive index changing periodically in the mirror plane direction. The vertical cavity surface emitting laser.

8 Claims, 11 Drawing Sheets

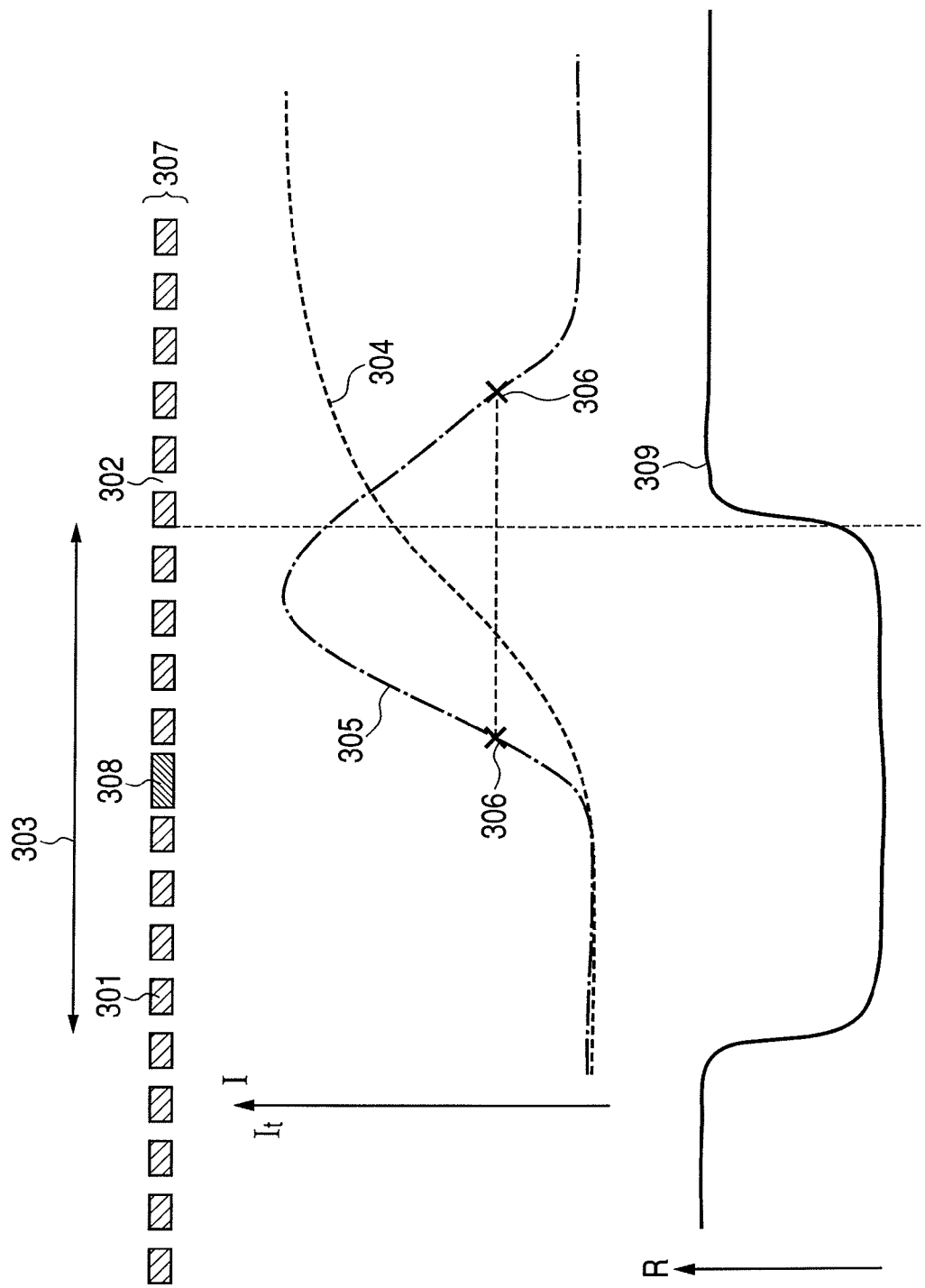

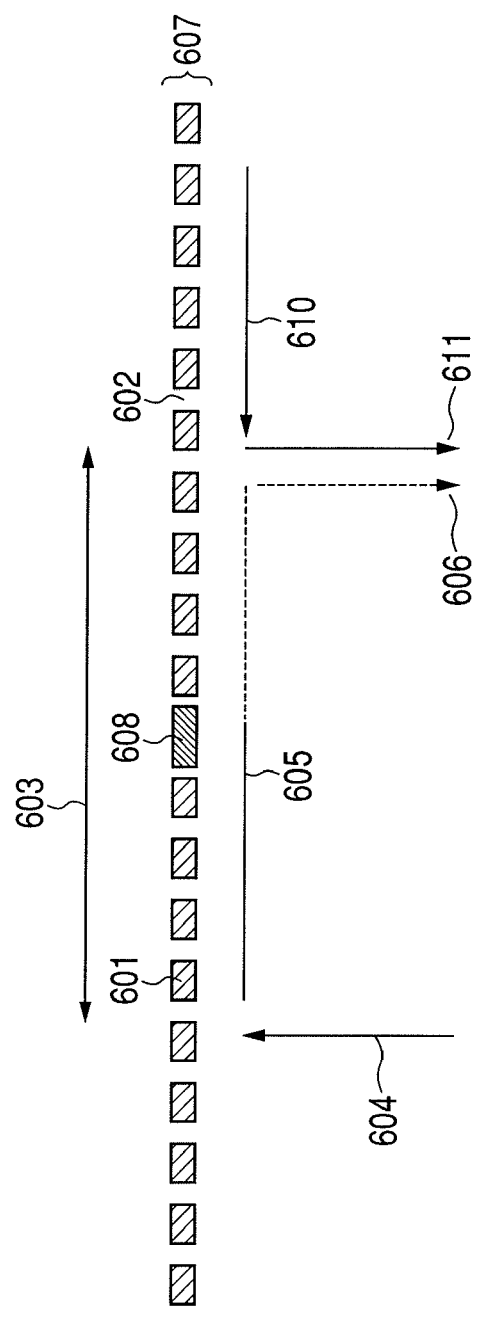
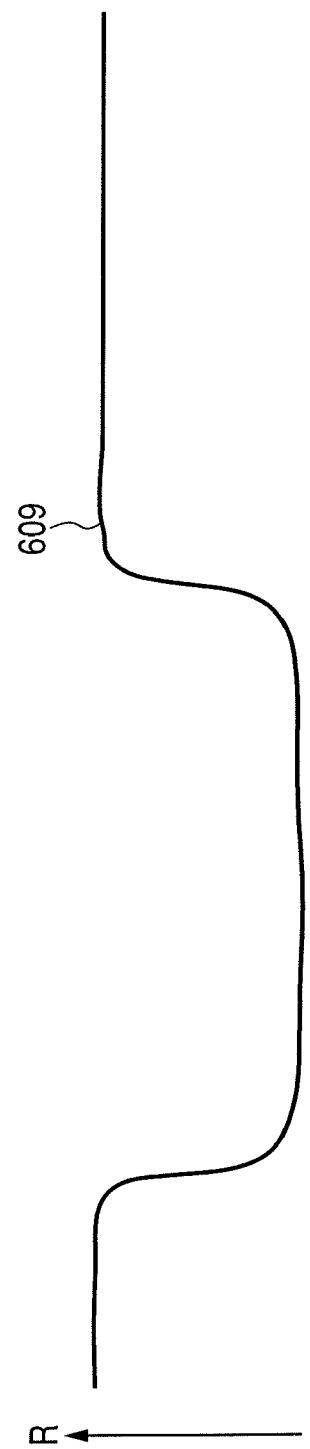
FIG. 6A
FIG. 6B

VERTICAL CAVITY SURFACE EMITTING LASER

BACKGROUND OF THE INVENTION

1. Field of the Invention

The present invention relates to a vertical cavity surface-emitting laser.

2. Related Background Art

A vertical cavity surface emitting laser (VCSEL) is one type of the surface-emitting lasers.

This laser is promising in the fields of communication, electrophotography, sensing, and so forth owing to ease of integration and arraying, high efficiency of coupling with an external optical system, and a low production cost. This laser has been already commercialized in a communication field such as infrared short distance communication.

Laser devices are being investigated which employ a thin grating structure in place of a distributed Bragg reflector (DBR) as the reflector of the surface emitting laser.
(Patent Document 1) U.S. Pat. No. 6,055,262
(Patent Document 2) Japanese Patent Application Laid-Open No. 2006-073823

Patent Document 1 discloses a photonic crystal surface-emitting laser employing as the mirror a structure which utilizes a guided resonance (GR) phenomenon by which the light beam introduced vertically onto the surface of a one-dimensional photonic crystal can be reflected at a ratio of nearly 100%.

The mirror of a photonic crystal utilizing the GR phenomenon enables constitution of a surface emitting laser thinner than the surface-emitting laser employing the DBR.

Specifically, a surface-emitting laser can be constituted by employing a grating mirror of several hundred micrometers thick in place of a DBR of several micrometers thick.

In the vertical cavity surface-emitting laser, the control of the lateral mode oscillation is important. In application to communication, the lateral mode output should be of a single mode.

To obtain the single lateral mode, in the conventional vertical cavity surface-emitting laser, a current-confining structure is formed by selective oxidation in the device to restrict the light-emission region of the active layer and simultaneously a waveguide structure is formed in the selectively oxidized portion.

By such a method, however, the oxide aperture should be made smaller for the single lateral mode oscillation. The smaller diameter narrowed by oxidation decreases the light emission region, making difficult a high output of the laser.

Therefore, methods are disclosed in which the reflectivity at the center portion of the mirror of the resonator is made higher than the peripheral portion thereof to facilitate oscillation in a single lateral mode as the fundamental mode.

Patent Document 2 discloses a surface emitting laser in which the reflectivity of the DBR is made higher at the center portion than the peripheral portion by constituting a DBR mirror by alternate lamination of pairs of two kinds of semiconductor films which have refractive index differences between the paired films increasing with the distance from the active layer.

DISCLOSURE OF THE INVENTION

Problem to Be Solved by the Invention

In Patent Document 2 above, the surface-emitting laser employs a DBR mirror to constitute the resonator, and the reflectivity is controlled by the DBR mirror constituted of lamination of pairs of two kinds of semiconductor films different in the refractive index.

That is, the reflectivity of the DBR mirror can be controlled at the center portion and the peripheral portion by causing a reflection loss of the higher mode in the periphery portion of the DBR mirror.

However, in the case where a photonic crystal is employed in the periodic structure having the refractive index varying periodically in the plane direction as disclosed in Patent Document 1, the intended reflection loss of the higher-order mode cannot be achieved even with the constitution disclosed in Patent Document 2.

To solve the above problem, the present invention intends to provide a vertical cavity surface emitting laser which is capable of producing single lateral mode oscillation by controlling the reflectivity at the center portion and the peripheral portion of the mirror by a simple structure even with a mirror of a periodic structure changing periodically the refractive

SUMMARY OF THE INVENTION

Means for Solving Problem

The present invention is directed to a vertical cavity surface emitting laser comprising first and second mirrors as reflecting mirrors comprised in a resonator, an active layer placed between the first mirror and the second mirror, and a current-confining layer for confining an electric current injected into the active layer; the first mirror having a periodic structure having a refractive index changing periodically in the mirror plain direction, and a phase-shift part, whereby a light beam introduced perpendicularly to the mirror plane resonating in the mirror plane direction and being reflected in a direction perpendicular to the mirror plane direction, and the reflectivity of a specified resonant mode in a region peripheral to the phase-shift part being made lower than the reflectivity in the regions other than the neighboring region.

The periodic structure can have one-dimensional periodic structure in which the refractive index changes periodically in one direction in the plane.

The one-dimensional periodic structure can be a one-dimensional photonic crystal, and therein two or more of the phase-shift portions are provided at positions not to cause light interference.

The periodic structure can have two-dimensional periodic structure in which the refractive index changes periodically in two directions in the plane.

The two-dimensional periodic structure can be a two-dimensional photonic crystal, and therein the phase-shift portions are provided in a closed polygonal shape at positions not to cause light interference between confronting sides of the phase shift portions.

The specified resonant mode can be formed by the current-confining layer.

The neighboring region can cover 4 to 10 periods of the periodic structure from the phase-shift part.

The neighboring region can cover 4 to 5 periods of the photonic crystal from the phase-shift part.

The current-confining layer can be formed to have an oxide aperture in the range from 5 to 8 μm, and the phase-shift part is placed outside the oxide aperture.

In the vertical cavity surface light emitting laser, a gap can be provided between the first mirror and the second mirror, the gap being adjacent to the upper mirror.

Effect of the Invention

According to the present invention, single lateral mode oscillation can be produced even with a mirror having the refractive index varying periodically within the plane direction, by controlling the reflectivity at the center portion and peripheral portion of the mirror with a simple construction.

Further features of the present invention will become apparent from the following description of exemplary embodiments with reference to the attached drawings.

BRIEF DESCRIPTION OF THE DRAWINGS

FIGS. 3A, 3B, and 3C are schematic drawings for showing correspondence of a cross-section of a photonic crystal mirror, light intensity distribution in a resonant mode inside a laser device resonator, and spatial distribution of reflectivity of a photonic crystal mirror. FIG. 3A is a schematic sectional view of a phase-shift peripheral portion of the photonic crystal mirror. FIG. 3B shows schematically light intensity distribution in the laser resonator. FIG. 3C shows schematically spatial distribution of the reflectivity of the photonic crystal mirror.

FIG. 4A is a graph showing the light intensity distribution of the resonant mode in the laser resonator, and showing the difference between the area surrounded by the fundamental mode and the area surrounded by the first-order mode in the range from a position in the device to peripheral side thereof. FIG. 4B is a graph showing the area surrounded by the fundamental mode and the first-order mode in the range from a position in the device to the peripheral side thereof.

FIG. 5A shows the relation of the oxidation narrowed diameter with the position of the intersection point of light intensity distributions of the fundamental mode and the first-order mode. FIG. 5B shows the relation of the oxide aperture with the position of the peak of the light intensity distribution of the first-order mode.

FIGS. 6A and 6B are a schematic sectional view showing behavior of the light beam around the phase-shift part of the photonic crystal mirror, and a schematic drawing of the spatial distribution of reflectivity of the photonic crystal corresponding thereto in the embodiment of the present invention. FIG. 6A is a schematic sectional view illustrating behavior of the light beam around the phase-shift part of the photonic crystal mirror. FIG. 6B is a schematic drawing showing the spatial distribution of reflectivity of the photonic crystal.

DESCRIPTION OF THE EMBODIMENTS

The vertical cavity surface emitting laser of embodiments of the present invention are described below in detail with reference to drawings.

Figure 1:
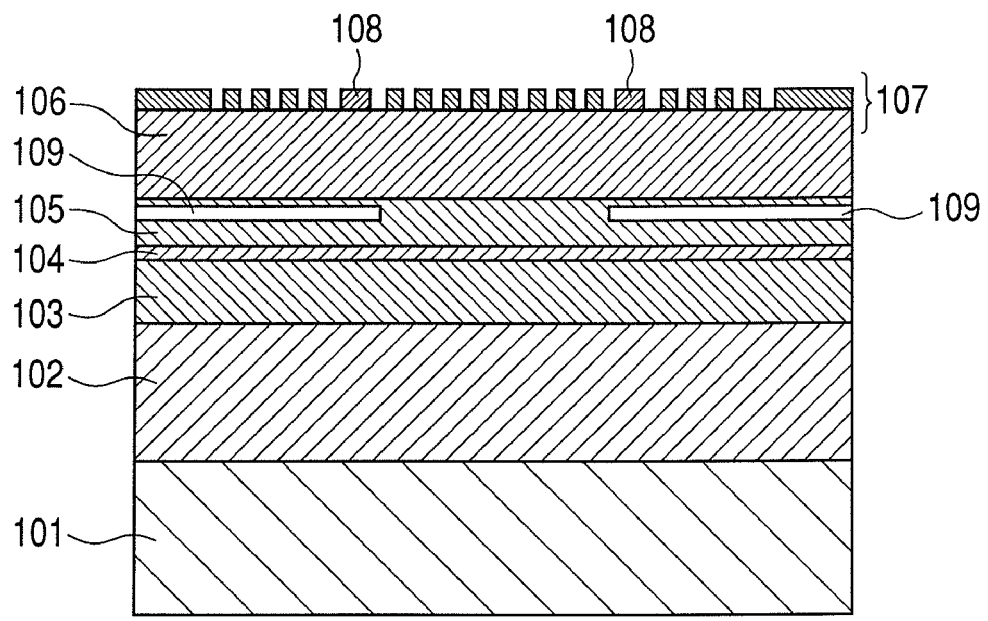
FIG. 1 is a schematic sectional view of a vertical cavity surface emitting laser of an embodiment of the present invention.

FIG. 1 is a schematic sectional view of a vertical cavity surface emitting laser of an embodiment of the present invention. In FIG. 1, the numerals denotes the followings: 101, a substrate; 102, a lower mirror; 103, a lower cladding layer; 104, an active layer; 105, an upper cladding layer; 106, a upper spacer layer; 107, an upper mirror; 108, a phase-shift part; and 109, current-confining layer.

Firstly, a device structure of a vertical cavity surface emitting laser of this embodiment is described below.

Lower mirror 102 is formed on substrate 101. On this lower mirror 102, are formed successively lower cladding layer 103, active layer 104, and upper cladding layer 105. Current-confining layer 109 is formed inside upper cladding layer 105.

Upper spacer layer 106 is provided on upper cladding layer 105.

Further thereon, upper mirror 107 is formed which has a periodic refractive index structure in the plane direction. A light beam introduced to this structure perpendicularly to the plane direction causes resonance in the plane direction, and is reflected perpendicularly to the plane direction.

Phase-shift part 108 is formed on upper mirror 107.

Upper spacer layer 106 is provided for obtaining a reflective index difference from upper mirror 107 for confining the light in upper mirror 107 effectively.

An active layer is provided between upper mirror 107 and lower mirror 102 to constitute a resonator.

Conventional electrodes (not shown in the drawing) are connected onto the bottom of substrate 101 and the layer of upper mirror 107.

In the light emitting device of this embodiment, light is produced by injection of electric current to active layer 104 from the electrodes, and the light is allowed to resonate by the resonator constituted of the members of from lower mirror 102 to upper mirror 107.

In the above embodiment, a mirror having a periodic structure is employed as upper mirror 107. Instead, the periodic structure mirror may be employed as the lower mirror, or both the upper mirror and the lower mirror may have the periodic structure.

When the periodic structure mirror is employed as lower mirror 102, the spacer layer for confining the light may be provided preferably on both the upper and lower sides of the mirror layer owing to the presence of substrate 101.

Next, an embodiment is described for constituting a photonic crystal mirror.

In this embodiment, a photonic crystal mirror is employed as upper mirror 107 having the periodic refractive index structure.

The photonic crystal has periodicity of the reflective index in a light wavelength order to control light transmission, it can be classified as one- to three-dimensional crystal structures corresponding to the number of the directions of the refractive index periodicity.

Figure 2:
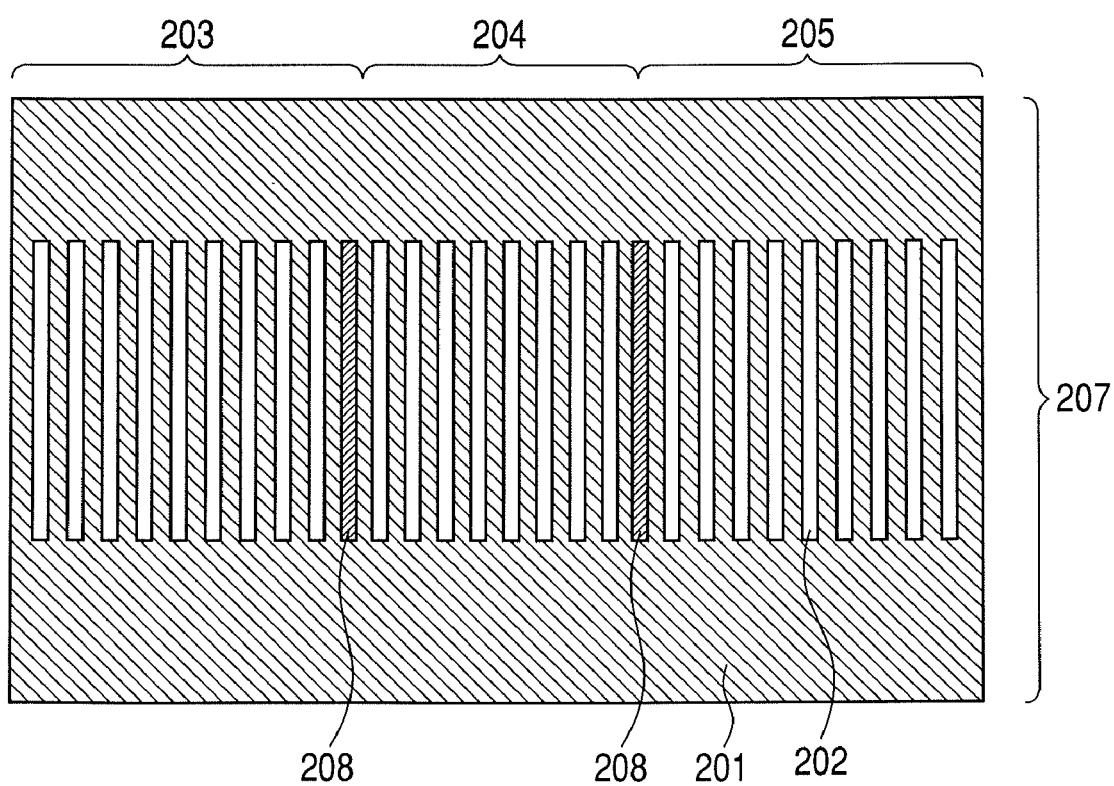
FIG. 2 is a schematic plan view of a photonic crystal mirror of an embodiment of the present invention.

FIG. 2 is a schematic plan view of a photonic crystal mirror of an embodiment of the present invention.

The photonic crystal may be any of the one- to three-dimensional photonic crystals. Here, a one-dimensional photonic crystal (grating structure) is taken as an example for explanation.

In FIG. 2, the numerals denote the followings: 201, a photonic crystal layer; 202, a slit; 203, a left-side pattern; 204, a central pattern; 205, a right-side pattern; 207, a photonic crystal mirror; and 208, a phase-shift part.

As illustrated in FIG. 2, photonic crystal mirror 207 is constituted by forming slits 202 periodically in photonic crystal layer 201.

Photonic crystal mirror 207 is defined by the parameters of the breadth of slit 202, the periodicity of slit 202, and the thickness of photonic crystal layer 201.

Of the above parameters, the pitch of gap 202 decides mainly the reflection wavelength of the mirror, and other parameters decide mainly the reflectivity of photonic crystal mirror 207 and the wavelength range of high reflectivity. Practically, the optimum structure is determined by numerical calculation of the structures to broaden high reflection range.

On photonic crystal mirror 207, phase-shift parts 208 are provided on two or more positions where the light passing through phase-shift parts 208 does not interfere. The two phase-shift parts divide the photonic crystal mirror 207 into three regions: left pattern region 203, central pattern region 204, and right pattern region 205.

This type of formation of phase-shift parts is limited to the one-dimensional photonic crystal. The formation of the phase-shift parts in the two-dimensional photonic crystal is described in the Example mentioned later.

Next, the materials of the photonic crystal mirror are described below.

Semiconductors and dielectrics which cause less loss are useful as the material for the photonic crystal mirror.

In FIG. 1, the material of the upper mirror 107 has a refractive index preferably higher than that of the material adjacent to the photonic crystal layer, like upper spacer layer 106.

The photonic crystal is particularly preferably surrounded by air, since the difference in the refractive index can be made sufficiently large when the upper spacer layer 106 is constituted of air. Thereby, the upper spacer layer has an air bridge structure in which a gap is formed in the sites adjacent to the photonic crystal.

When the photonic crystal mirror (upper mirror 107) is formed from a semiconductor, an electric current can be injected through the mirror layer.

When the photonic crystal mirror layer is formed from a dielectric material, the current cannot be injected through the mirror, so that the current is injected laterally.

The mirror can be constituted from a conductive transparent oxide semiconductor (ITO: indium tin oxide; and the like). With such a mirror, the current can be injected through the mirror.

The semiconductor material includes III-V Group compound semiconductors such as GaAs, AlGaAs, InP, GaAsInP, AlGaInP, GaN, InGaN, AlGaN, AlN, and InN, and any mixed crystals thereof; II-VI Group compound semiconductors such as ZnSe, CdS, and ZnO, and any mixed crystals thereof; IV Group semiconductors such as Si, and SiGe, and any mixed crystals thereof; and various organic semiconductors.

The dielectric material includes oxides such as $SiO_2$, $TiO_2$, $ZrO_2$, $TaO_2$, and $HfO_2$; non-linear mediums such as $\beta\text{-}BaB_2O_4$, $LiNbO_3$ (LN), $LiTaO_3$, and $KTiPO_4$. Resin materials such as PMMA (polymethyl methacrylate), and acrylic resins.

Next, the active layer and the cladding layer are described for constituting the vertical cavity surface emitting laser of this embodiment.

The active layer may have a quantum well structure, a strained quantum well structure, a quantum dot structure, or a like structure. This active layer is held between the cladding layers to form a resonator together with mirrors. An SCH layer (separate confinement heterostructure layer) may be provided for confining the electric current between the active layer and the cladding layer.

As the material of the active layer and the cladding layer, semiconductors are useful, the semiconductors including all of the above-mentioned semiconductor materials. A resonator is constituted from the active layer, the cladding layers, the upper mirror, the lower mirror, and light-confining layer of a photonic crystal mirror (on the active layer side when the layers are provided on the both sides of the mirror layer). The cladding layers are doped with different types of the carriers of p or n respectively.

Next, the conditions are described for the vertical cavity surface emitting laser and a method of injection of an electric current in this embodiment.

As the conditions for the resonator, the total of the optical path lengths (L) of the active layer, the cladding layers, and the above-mentioned light confining layer and the phase shifts ($\Phi u$, $\Phi d$) caused by two reflections at the upper and lower mirrors should satisfy the relation: $2L+\Phi u+\Phi d=m\lambda$.

The laser device of this embodiment can be driven by current injection through a p-electrode and an n-electrode.

The material for the electrodes may be selected from any of metals including the materials employed in commercial semiconductor laser processes.

The electrode material for the semiconductor material is conventionally established and the technique of electrode formation is nearly completed in commercial semiconductor laser processes. Therefore, the conventional material and the conventional process may be employed.

For example, for a GaAs n-electrode, Au—Ge—Ni, and Au—Ge—Pt are useful, and for a p-electrode, Ag—Zn, and Au—Zn are useful.

Other than the metals, a conductive transparent oxide such as ITO, $SnO_2$, and $InO_2$ are useful as the electrode.

The electrode on a mirror layer having a photonic crystal structure is formed preferably at a position other than that of the photonic crystal.

Next, the kind of the mirror is described which is useful in the vertical cavity surface emitting laser of this embodiment.

A mirror other than the photonic crystal mirror having a periodic structure useful in this embodiment is a DBR mirror constituted of a semiconductor or a dielectric material. The mirror pair may be a combination of a photonic crystal and a DBR mirror, or another mirror constituted of a photonic crystal mirror and several pairs of DBR mirrors.

The mirror having a periodic structure may contain a photonic crystal mirror therein.

The DBR mirror is a conventional one constituted of superposition of mediums having different refractive indexes each having the optical path length of ¼ wavelength.

The mirror may be formed from a semiconductor, a dielectric material, or a metal, the material being preferably transparent to the oscillation wavelength and being a semiconductor material for injection of the current through the mirror. The combination of materials for the semiconductor DBR mirror includes $Al_xGa_{1-x}As/Al_x'Ga_{1-x'}As$; $In_xGa_{1-x}As_yP_{1-y}/In_x'Ga_{1-x'}As_y'P_{1-y'}$; $GaN/Al_xGa_{1-x}N$. The combination of the dielectric material includes $SiO_2/TiO_2$, $SiO_2/ZrO_2$, $TaO_2/SiO_2$, and $ZrO_2/HfO_2$, and any combination thereof.

Next, the mechanism of reflectivity control in the mirror of vertical cavity surface emitting laser of this embodiment is described below.

The above-mentioned phase-shift part enables control of spatial distribution of the reflectivity in the mirror with periodic structure. The physical image thereof is described below.

FIG. 6A is a sectional view illustrating schematically the behavior of light in the neighboring region of the phase-shift part of a photonic crystal mirror of this embodiment. FIG. 6B is a schematic drawing showing the spatial distribution of the reflectivity in the photonic crystal mirror.

FIG. 6A illustrates schematically the photonic crystal structure and transmission of the light at and around the phase-shift part, which is an enlarged illustration of the left portion of photonic crystal mirror 207 illustrated in FIG. 2.

In FIGS. 6A and 6B, the numerals denote the followings: 601, a photonic crystal layer; 602, a slit; 603, a reflectivity-lowered region; 604, incident light-1; 605, guided light-1; 606, reflected light-1; 607, a photonic crystal mirror; 608, a phase-shift part; 609, spatial distribution of the reflectivity; 610, guided light-2; 611, guided light-3.

Phase-shift part 608 is placed on the same plane as photonic crystal layer 601. In FIG. 6A, firstly incident light-1 (604) introduced to the photonic crystal is diffracted by the photonic crystal structure, and is guided as guided light-1 (605) through photonic mirror 607. This light is passed through phase-shift part 608 and diffracted again and taken out as reflected light-1 (606), and diffracted again.

This light causes interference with directly reflected and 2 times-diffracted light to achieve the reflectivity or the transmittance of 100%. This is called "guided resonance".

By passing the phase-shift part, the phases of guided light-1 (605) and reflected light-1 (606) are shifted. In FIG. 6A, the light having its phase shifted is denoted by the broken line.

This reflected light-1 (606) interferes with guided light-3 (611) formed by diffraction of guided light-2 (610) which has not passed through the phase-shift part to cause canceling with each other by interference, whereby the reflectivity at and around the phase-shift part can be controlled.

In particular, when the phase is shifted by λ/2 to cause destructive interference, the reflectivity in this portion can be minimized.

Next, the range of lowering of the reflectivity is considered.

In FIG. 6A, reflectivity-lowered region 603 is within the distance of guiding of light through the mirror. Therefore, as shown in FIG. 6B, the reflectivity-lowered region covers a certain area on both sides of the phase-shift part.

The size of this region is adjusted by controlling the light propagation distance. This light propagation distance is controlled by adjusting the refractive index contrast of the photonic crystal.

The reflectivity-lowered region is described below. The refractive index contrast of the photonic crystal depends on the material, and can be maximized with the photonic crystal constituted of a high index solid material like a semiconductor and slits.

In addition to this constitution, when an air gap is provided as the layers adjacent to the photonic crystal (in this embodiment, an air bridge structure is formed by the air gap in the upper spacer layer 106), the effective contrast of the refractive indexes is made still larger, and the guiding distance of light in the photonic crystal is minimized. For example, in a constitution in which the slit structures are formed periodically in a material having a refractive index of 3.6 and the material is surrounded by air, the light propagation distance, namely the range of refractivity index decrease, corresponds to about four periods of the photonic crystal from the phase-shift part.

Although this range can be broadened by lowering the contrast of the refractive index, the range is preferably adjusted so as not to cause interference with the light propagating from the other phase-shift part.

When the light beam which has passed through the phase-shift parts is introduced into the center of the mirror to cause interference, the reflectivity at the mirror center decreases unpreferably.

Thus, with a lower contrast of the refractive index, the phase-shift parts should be placed apart more, and the device mirror size should be larger. Therefore, the contrast of the refractive index is preferably larger.

At the refractive index of about 2.4, the range of the reflectivity-lowered region is about ten periodic distance of the photonic crystal.

As described above, the reflectivity-lowered region extends preferably in the range of four to ten periods from the phase-shift part, more preferably extends in the range of four to five periods from the phase-shift part.

In this embodiment, the type of the phase-shift part and the material can be selected as below.

The above-mentioned phase-shift part 608 can be provided within the plane of the photonic crystal as in this embodiment, or can be provided in a layer adjacent to the plane. In the former case, the amount of the phase shift of the guided light can be made larger than in the latter case.

The material of the phase-shift part may be the same as or different from the material of the photonic crystal.

Next, the relation of the phase-shift part with the light intensity distribution is described.

FIGS. 3A to 3C illustrate schematically a cross-section of a photonic crystal mirror, the light intensity distribution of a resonant mode in the laser resonator, and the spatial distribution of the reflectivity of the photonic crystal mirror of this embodiment, correspondingly.

FIG. 3A illustrates schematically a cross-section of the phase-shift part and the neighboring region thereof in a photonic crystal mirror. FIG. 3B shows schematically the light intensity distribution of a resonant mode in the laser resonator. FIG. 3C shows schematically the spatial distribution of the reflectivity of the photonic crystal mirror of this embodiment.

FIG. 3A is a cross-sectional view of the mirror similarly as in FIG. 6A. Phase-shift part 308 is provided inside photonic crystal layer 301.

FIG. 3B illustrates schematically the light intensity distribution in the device photonic crystal mirror shown in FIG. 3A.

In FIGS. 3A-3C, the reference numerals denote the followings: 301, a photonic crystal layer; 302, a slit; 303, a reflectivity-lowered region; 304, light intensity distribution of a fundamental mode (0thorder mode); 305, light intensity distribution of a first-order mode; 306, a boundary of a tail portion of the first-order mode; 307, a photonic crystal mirror; 308, a phase-shift part; and 309, spatial distribution of the reflectivity.

By the reason mentioned above, the distribution of the reflectivity can be controlled by lowering the reflectivity at or around phase-shift part 308 but not lowering the reflectivity in other region.

As described above, the function of the mode loss can be introduced by lowering the mirror reflectivity in light intensity distribution 305 of the first-order mode only without changing the mirror reflectivity of light distribution 304 of the fundamental mode light. Thereby a laser can be provided which is capable of causing single lateral mode oscillation. FIG. 3C illustrates the reflectivity distribution of the mirror controlled by employing phase-shift part 308 in correspondence with the device structure of photonic crystal mirror.

In this embodiment, the reflectivity of the mirror can be lowered by phase-shift part 308 in a range within a certain distance on both sides of the phase-shift part. In FIG. 3A, the region in which the reflectivity of the mirror can be lowered is denoted by the reference numeral 303.

Overlapping of reflectivity-lowered portion 303 with the region of the light intensity distribution 305 of the first-order mode, it is obvious that light enables loss in the first-order mode, and enables readily oscillation of the single lateral mode.

The boundary of the region of light intensity distribution 305 of the first-order mode light is at a portion where the light intensity becomes smaller as illustrated in FIGS. 3A-3C. More specifically the boundary is defined as the level of $1/e^2$ of the second-order moment of the intensity distribution function. This definition is in accordance with the general definition of the beam diameter.

Further, preferred mode control is described below.

Figure 4A:
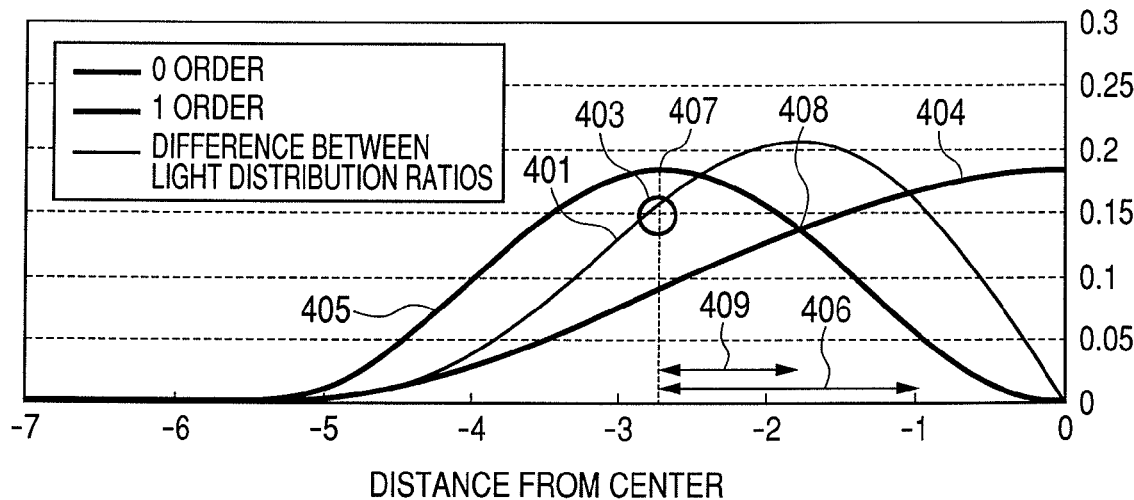
FIGS. 4A and 4B are graphs showing light intensity distribution in resonant mode in a laser resonator of an embodiment of the present invention, and showing the difference in the areas surrounding the fundamental mode and the first-order mode between a designated spot and a graph showing the area surrounded by the fundamental mode and the first-order mode in the range from a position in the device to the peripheral side thereof.

FIG. 4A is a graph showing the light intensity distribution of the resonant mode in the laser resonator, and showing the difference between the area surrounded by the fundamental mode curve and the area surrounded by the first-order mode curve in the range from a position in the device mirror to peripheral side thereof.

Figure 4B:
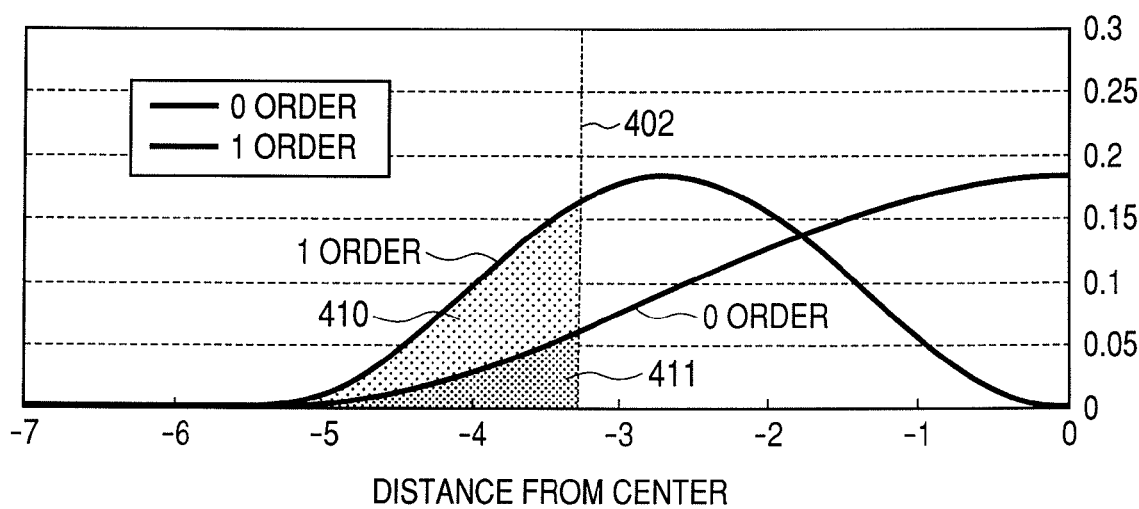

FIG. 4B is a graph showing the area surrounded by the fundamental mode curve and the first-order mode curve in the range from a position in the device mirror to the peripheral side thereof.

FIG. 4A shows fundamental mode light intensity distribution 404 and first-order mode light intensity distribution 405, and curve 401 showing difference between the area surrounded by the distribution curve of fundamental mode and the distribution curve of first order mode in the range from a position in the mirror to the periphery side. And all of them are on the line directing from the mirror center to the outside.

FIG. 4B is a drawing for explaining curve 401 in FIG. 4A.

In FIG. 4A and FIG. 4B, the reference numerals denotes the followings: 402, an example of the reflectivity boundary position of the mirror; 403, the level of curve 401 at the position of the peak of the first-order mode; 406. the preferred range of the reflectivity boundary of the mirror; 407, the peak of the intensity distribution of the first-order mode; 408, the intersecting point of the intensity distribution of the fundamental mode and that of the first-order mode; 409, a more preferable range of the reflectivity boundary of the mirror; 410, the area surrounded by the first-order mode curve; 411, the area surrounded by the fundamental mode curve. For selecting the mode, a loss in the first-order mode should be caused by lowering the reflectivity of the mirror.

Therefore, at least the reflectivity-lowered region should overlap the first-order mode light distribution. More preferably, the loss in the first-order mode is larger than the loss in the fundamental mode.

Next, the preferred position of the boundary of the reflectivity-lowered region of the mirror in the light intensity distribution is described below.

In FIG. 4A, curve 401 shows the difference between the area surrounded by the light intensity distribution curves in the range from a position in the mirror to the periphery.

For example, when the reflectivity-lowered region has the boundary at the position indicated by the numeral 402 in FIG. 4B, curve 401 is drawn by plotting the area difference derived by subtracting area 411 surrounded by the fundamental mode curve from the area 410 surrounded by the first-order mode. Both areas can be obtained by integration of each mode curve from a point to the peripheral side in the mirror.

This corresponds to the difference in the light extinction ratio between the fundamental mode and the first-order mode at position 402. Therefore, the larger value is advantageous in terms of selection of the mode.

As shown in FIG. 4A, the area difference represented by curve 401 reaches the maximum at the intersecting point of the fundamental mode and the first-order mode.

Therefore, the boundary of the reflectivity-lowered region should be brought into the range in which the area difference is large. Preferably, the reflectivity-lowered region is placed at the position in which the difference obtained by subtraction of the spatial integration of the light intensity distribution of the fundamental mode, of which integral interval is from top of the first mode curve to the periphery side, from the spatial integration of the light intensity distribution of the first-order mode with the same integral interval as fundamental mode curve. Specifically, it is preferable that the level of curve 401 is brought higher than the level of curve 401 at the peak of the first-order mode (the point indicated by circle 403, in the range indicated by numeral 406).

More preferably, the boundary of the reflectivity-lowered region is placed between the peak of the light intensity distribution of the first-order mode and the intersecting point of light intensity distribution curves of the first-order mode and the fundamental mode(range 409 in FIG. 4B). This adjustment is made to increase the reflectivity of the fundamental mode and to decrease the loss in the fundamental mode.

Next, the position of the phase-shift part in the mirror and the extent of the phase shift are described below.

The phase-shift part may be introduced at a position of at least two periods apart from the edge of the photonic crystal structure.

This is the same in the case where the photonic crystal is two-dimensional and the phase-shift parts are arranged in a closed shape (as described later in Examples).

Generally, the pattern of the photonic crystal is uniform in the central region in the mirror, and the pattern uniformity can be impaired so the process pattern can be disordered near the peripheral portion (end effect)

Usually this disorder is corrected carefully by adjusting the process conditions. However, in the photonic crystal mirror, the reflectivity-lowered region can be formed by adjusting the position of the phase-shift part. In other words, the size of the flat reflectivity region can be controlled.

For example, when a photonic crystal is prepared in a large area without correction of the process and a mirror is prepared by only utilizing the central region thereof having uniform process pattern, the boundary of lower reflectivity is far from the current confinement structure of the device.

As mentioned above, when phase-shift part is not introduced, the reflectivity is not lowered at and around the current confinement structure and the mode control is prevented. However, introduction of the phase-shift part lowers the reflectivity at or around of the confinement structure to enable the mode control.

Thus, the phase-shift part enables production of the mirror in a large area and use of the central region of the uniform pattern, and decrease of the load for adjusting the process conditions.

In this case, preferably the photonic crystal pattern is firstly formed and thereafter the phase-shift part is formed. If the phase-shift part is formed simultaneously with formation of the photonic crystal pattern (if the defect is incorporated firstly into the photonic crystal pattern), the pattern neighboring the phase-shift part is liable to be disturbed to impair the effect.

As to the extent of the phase shift, the interference effect of the extinctive interference is greatest at the phase shift of $\lambda/2$, where the reflectivity is highest and decreases rapidly with the phase shift. With increase or decrease of the phase shift from $\lambda/2$, the extinctive interference effect becomes less, making the decrease of the reflectivity less and gradual.

According to the above characteristics, a large phase shift causes a large loss of a higher order mode, but simultaneously causes a large loss of the fundamental mode also.

Therefore, for the higher extinction ratio of the fundamental mode to the first-order mode, the phase shift is preferably adjusted to be $\lambda/2+n\lambda$ (n: an integer).

Conversely, with a smaller phase shift, although the extinction ratio cannot be sufficient, the threshold of the fundamental mode can be lowered and the output thereof can be increased preferably.

When the phase is not shifted or the phase is shifted just by an integral multiple of the wavelength, the extinctive interference will not occur and the effect of the present invention cannot be achieved.

Next, the kind of the photonic crystal in this embodiment is described.

In the above embodiment, the upper mirror is made from a one-dimensional photonic crystal which has refractive index changing periodically in one direction in the plane, but the construction of the mirror is not limited thereto.

A two-dimensional photonic crystal having a two-dimensional periodic structure can be used which has the refractive index changing periodically in two directions in the plane. A three-dimensional photonic crystal also can be used.

The one-dimensional photonic crystal in this embodiment has the refractive index modulation in the depth ranging in the thickness of the photonic crystal layer (for example, the depth d of slit is the same as the thickness t of the photonic crystal layer).

The depth of the change may be less than the layer thickness (d<t), or more than that (d>t).

At d<t, the refractive index contrast tends to be lower and the phase-shifting layer need to be set apart, which tends to make the device area larger.

Therefore for decreasing the device area, preferably d=>t. For a larger area, d may be smaller or larger than t.

When a two-dimensional crystal is employed, the phase-shift parts are introduced not at two positions only, but may be introduced in a polygonal arrangement to surround the mirror region of the photonic crystal. In the arrangement, confronting sides of the polygon of the phase-shift parts are placed not to cause interference of the light by the phase-shift parts.

The lattice points of the photonic crystal may be arranged in a triangle lattice, a tetragonal lattice.

The lattice points may be in various shapes: circular, ellipsoidal, triangular, square, or rectangular.

The period of the lattice may be uniform, or varied. In particular, for control of polarized light, the lattice period is preferably changed in the direction.

With the lattice points arranged in a polygonal lattice, the phase-shift parts are arranged in a closed polygonal shape having the number of the sides corresponding to the number of the resonance directions.

This is because, in the photonic crystal, the resonance can occur in the directions of the number of the symmetry, and the phase-shift parts are introduced perpendicularly to the resonance direction. Specifically the number of the sides of the phase-shift parts is double the rotational symmetry number of the lattice arrangement in the photonic crystal: for example, tetragonal in a two-symmetrical tetragonal lattice, and hexagonal in the three-symmetrical hexagon.

The light beams passing through the confronting sides of the phase-shift parts should not couple with each other. The matters regarding the depth of the refractive index change in one-dimensional photonic crystal are true in this case.

Next, the relation between the internal light intensity distribution and the current-confining layer is described below.

In FIG. 1, current-confining layers 109 are provided inside upper cladding layer 105. Instead, current-confining layers 109 may be provided inside any of lower mirror 102, lower cladding layer 103, upper spacer layer 106, and upper mirror 107. The applicable confining structure includes oxidation-formed confining layers, and ion-injected high resistance layers.

The preferred range of the position of the reflectivity-lowered region caused by the phase-shift part (the range indicated by the numerals 406 and 409 in FIG. 4A and FIG. 4B) can be calculated by effective refractive index approximation in consideration of the confining layer.

These matters are described with reference to FIGS. 5A and 5B.

Figure 5A:
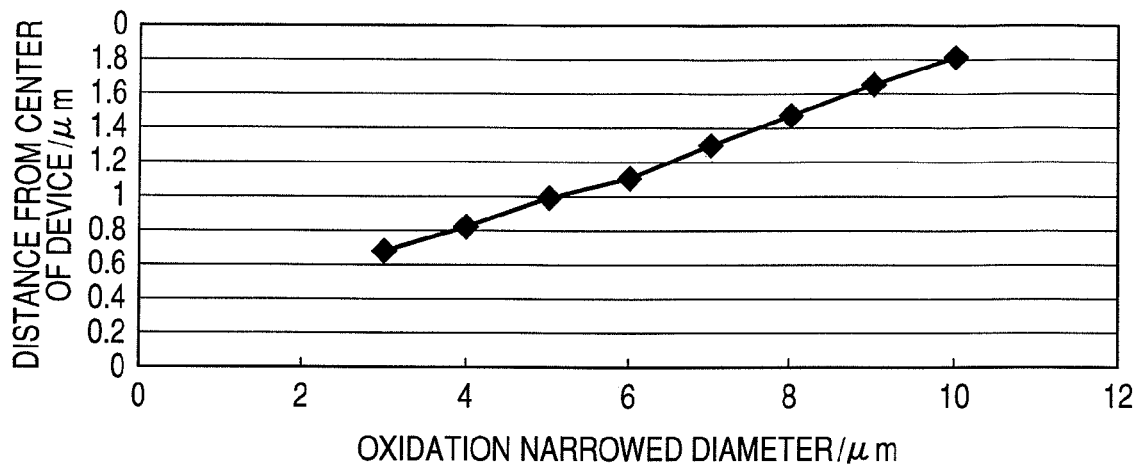
FIGS. 5A and 5B are respectively a graph showing the relation of the oxide aperture with the position of the intersecting point of light intensity distributions of the fundamental mode and the first-order mode in the laser resonator of an embodiment of the present invention, and a graph showing the relation of the oxide aperture with the position of the peak of the light intensity distribution of the first-order mode.
Figure 5B:
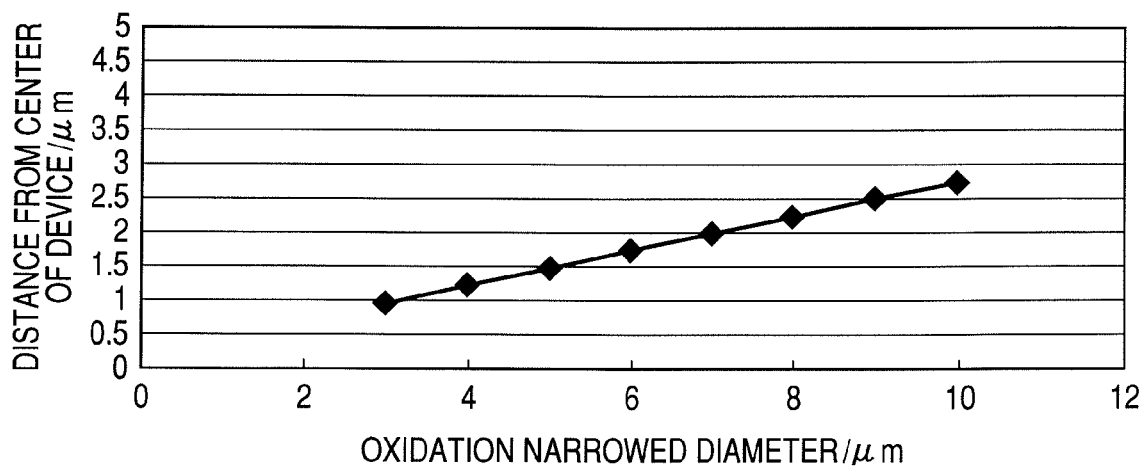

FIGS. 5A and 5B are respectively a graph showing a relation of the position of the intersecting point of light intensity distribution of the fundamental mode and the first-order mode in the laser resonator with the oxide aperture; and a graph showing a relation of the position of the peak of the first-order mode light intensity distribution with the oxide aperture in the laser resonator in this embodiment.

FIG. 5A is a graph showing a relation of the position of the intersecting point of light intensity distribution of the fundamental mode and the first-order mode in the laser resonator with the oxide aperture. FIG. 5B is a graph showing a relation of the position of the peak of the first-order mode light intensity distribution with the oxide aperture in this embodiment.

FIGS. 5A and 5B show respectively dependence of the position of the peak of the first-order mode on the oxide aperture, and dependence of the position of the intersecting point of the light intensity distribution curves of the fundamental mode and the first-order mode on the oxide aperture in the range from 3 μm to 10 μm of the oxide aperture.

The both are respectively in a linear relation with the oxide aperture. These are calculated by assuming the effective refractive index difference to be 0.3.

Usually, at the oxide aperture of 5 μm or more in the oxidation-confining layer, some measure is required occasionally for forming a single mode.

When the oxide aperture is in the range from 5 to 8 μm, the phase-shift portion can be introduced outside the oxide aperture by placing the reflectivity-lowered region between the peak of the first-order mode and the intersecting point of the light intensity distributions of the first-order mode and the fundamental mode.

In this case, at the highest contrast of the refractive index, the phase-shift part can be introduced outside the oxide aperture, as a marker of the selective oxidation.

EXAMPLES

The present invention is described with reference to examples.

Example 1

Example 1 describes a constitution of a vertical cavity surface emitting laser of the present invention.

Figure 7:
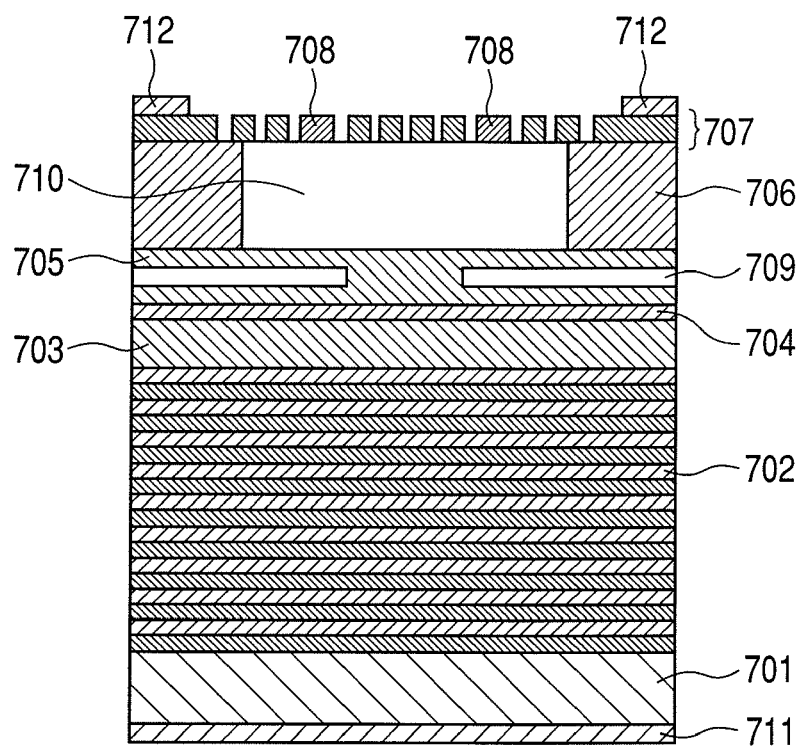
FIG. 7 is a schematic sectional view of the vertical cavity surface emitting laser of Example 1 of the present invention.

FIG. 7 illustrates schematically a cross-section of the vertical cavity surface emitting laser of this Example. In FIG. 7, the reference numerals denote the followings: 701, a substrate; 702, a DBR mirror; 703, a lower cladding layer; 704, an active layer; 705, an upper cladding layer; 706, an upper spacer layer; 707, a photonic crystal mirror; 708, a phase-shift part; 709, an oxidation-formed confining layer; 710, an air-bridge structure; 711, an n-electrode; and 712, a p-electrode.

In this Example, DBR mirror 702 is formed on substrate 701.

DBR mirror 702 is formed by alternate lamination of lower refractive-index layers and higher refractive-index layers of an optical thickness of λ/4.

The lower refractive-index layer is formed from n-$Al_{0.12}Ga_{0.88}As$, and the higher refractive-index layer is formed from n-$Al_{0.9}Ga_{0.1}As$. The number of the pairs of the lower refractive-index layer and the higher refractive-index layer is decided suitably in consideration of the reflectivity necessary for the oscillation. In this example, 34 pairs are employed.

On this DBR mirror 702, are formed successively lower cladding layer 703, active layer 704, and upper cladding layer 705 successively.

Lower cladding layer 703 is formed from n-$Al_{0.3}Ga_{0.7}As$, and upper cladding layer 705 is formed from p-$Al_{0.3}Ga_{0.7}As$. Active layer 704 has a quantum well structure of GaAs/$Al_{0.3}Ga_{0.7}As$.

In upper cladding layer 705, oxidation-formed confining layer 709 is provided for controlling the current injection.

This oxidation-formed confining layer 709 is provided by firstly forming a semiconductor layer of $Al_{0.97}Ga_{0.03}As$ containing Al at a higher content in the lower cladding layer and then oxidizing this layer with steam or the like.

On upper cladding layer 705, upper spacer layer 706 is formed. The center portion thereof is gaped to form air-bridge structure 710.

Further thereon, photonic crystal mirror 707 is formed. On two positions on one-dimensional photonic crystal mirror 707, phase-shift parts 708 are formed.

The above air-bridge structure 710 is provided to secure a refractive index difference from photonic crystal mirror 707. This structure enables effective confinement of light in photonic crystal mirror 707.

Air-bridge structure 710 can be formed, after patterning and transfer of the photonic crystal, by removing selectively the upper spacer layer by use of citric acid or the like through the gaps of the photonic crystal.

Photonic crystal mirror 707 is formed from $Al_{0.6}Ga_{0.4}As$, and upper spacer layer 706 is formed from GaAs.

The resonator has two mirrors: photonic crystal mirror 707 and DBR mirror 702.

Photonic crystal mirror 707 is capable of causing resonance of the light independently in the mirror plain direction.

On the reverse face of substrate 701, n-electrode 711 is connected, and on photonic crystal mirror 707, p-electrode 712 is connected. The periphery portion is grooved to form a mesa structure (not shown in the drawing) having the mesa diameter of 20 μm.

In the light emitting device of this Example, a current is injected from the electrode to active layer 704, and the light generated by active layer 704 is allowed to resonate in the resonator constituted of the members from DBR mirror 702 to photonic crystal mirror 707. The wavelength of the emitted light is 850 nm.

The constitutions and dimensions of the members of the structure in this Example are described below.

Figure 8:
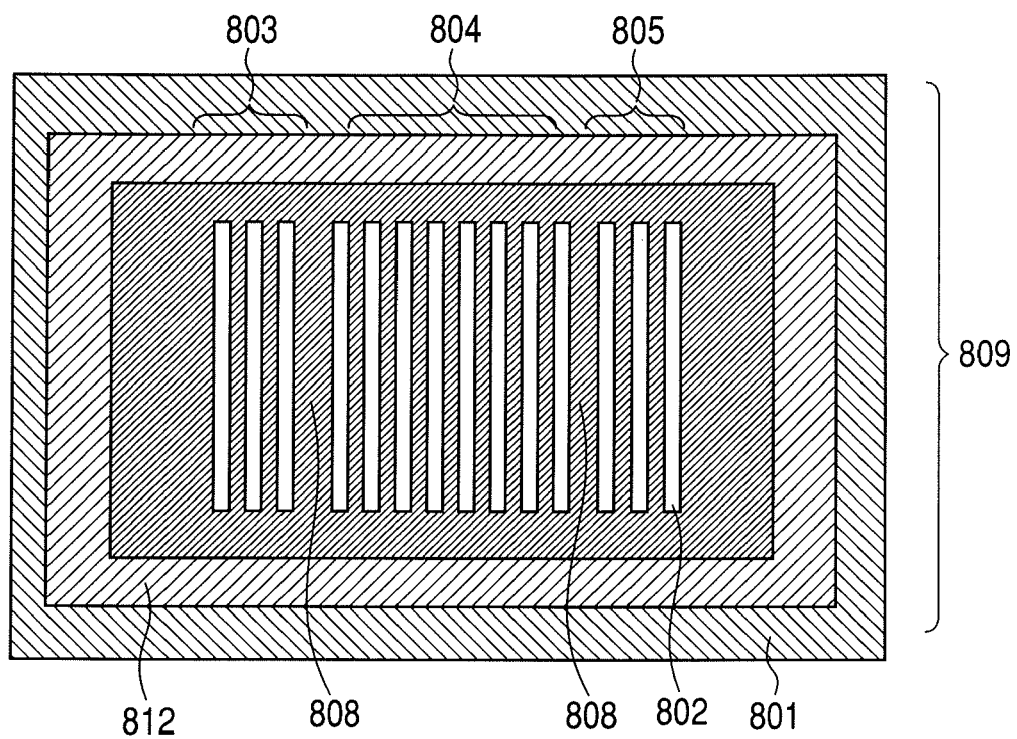
FIG. 8 is a schematic plan view of the photonic crystal mirror of the vertical cavity surface emitting laser of Example 1 of the present invention.

FIG. 8 is a schematic plan view of a photonic crystal mirror of the vertical cavity surface emitting laser of Example 1 of the present invention.

FIG. 8 is a plan view of photonic crystal mirror 707 employed in this Example illustrated in FIG. 7. In FIG. 8, p-electrode 812 is connected to the structure illustrated in FIG. 2.

The lower two digits of the reference numerals for denoting other constructing members correspond entirely to those in FIG. 2.

Photonic crystal mirror 809 has gaps 802 of 130 nm in width, a gap period of 375 nm, and has a photonic crystal layer 801 of thickness of 235 nm. Those parameters are decided by numerical calculation to obtain a sufficient width of the reflection range of the photonic crystal mirror.

The photonic crystal mirror has a size of about 10 μm in the periodicity direction of the photonic crystal, and 8 μm perpendicularly to the periodicity direction, and has 26 periods of the photonic crystal.

In this Example, the oxide aperture is in a shape of a circle of 10 μm diameter. The area of the photonic crystal is designed to be suitable for the mode control, specifically from the view point below.

In this Example as illustrated in FIGS. 3A-3C, reflectivity-lowered region 303 corresponds to ten periods of the photonic crystal (about 3.8 μm).

Figure 9:
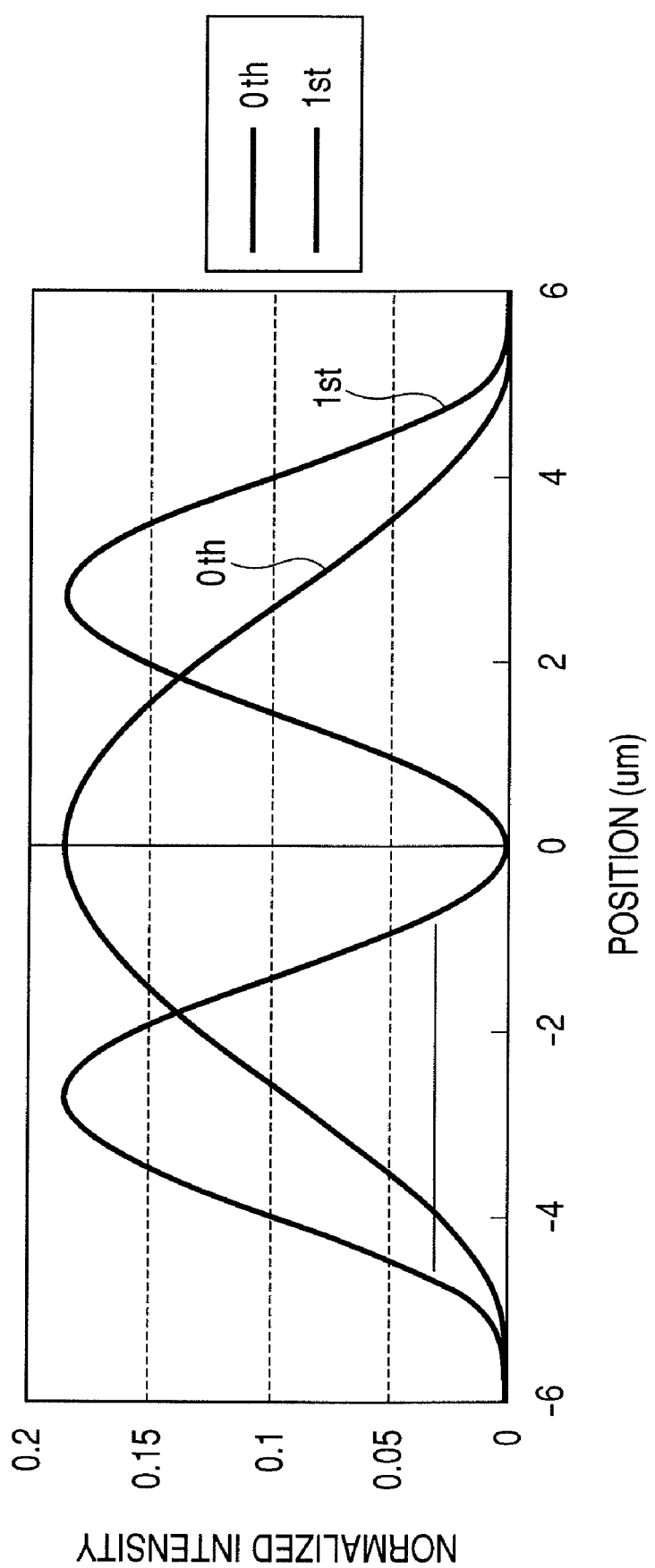
FIG. 9 is a graph showing a calculated distribution of the light intensity in the resonator of the vertical cavity surface emitting laser of Example 1 of the present invention.

FIG. 9 is a graph showing calculated light intensity distributions of the resonant mode in the resonator of the vertical cavity surface emitting laser of this embodiment. As shown in FIG. 9, the higher mode distributes in the range from 0.23 μm to 4.33 μm apart from the center of the device.

Therefore, in this Example, the phase-shift part is placed outside by 1.9 μm from this range: in the range from 6.23 μm to 2.13 μm from the center.

In this Example, the phase-shift parts are placed at a position of 3 μm apart from the center. Therefore, of the 26 periods, 16 periods is placed at the inside (the center side of the device) of the phase-shift parts, and ten periods are placed outside (five periods at the right side and other five periods at the left side).

Incidentally, FIGS. 7 and 8, which are schematic drawings, do not reflect precisely the period number and the size mentioned above.

The n-$Al_{0.12}Ga_{0.88}As$ layer and the n-$Al_{0.9}Ga_{0.1}As$ layer of the DBR mirror have respectively a thickness of 60 nm, and 69 nm. Air-bridge layer 710 (upper spacer layer 706) has a thickness of 1065 nm (about 5/4λ). Active layer 704 has three layers of quantum wells, the well portions having a thickness of 6 μm. The barrier layer has a thickness of 8 μm. The upper and lower cladding layers have respectively a thickness of 105 nm. The total optical path length of the cladding layers and the active layer corresponds just to one wavelength of the resonance.

The extent of the phase shift is λ/2, whereby the extinctive interference effect is maximized.

Figure 10:
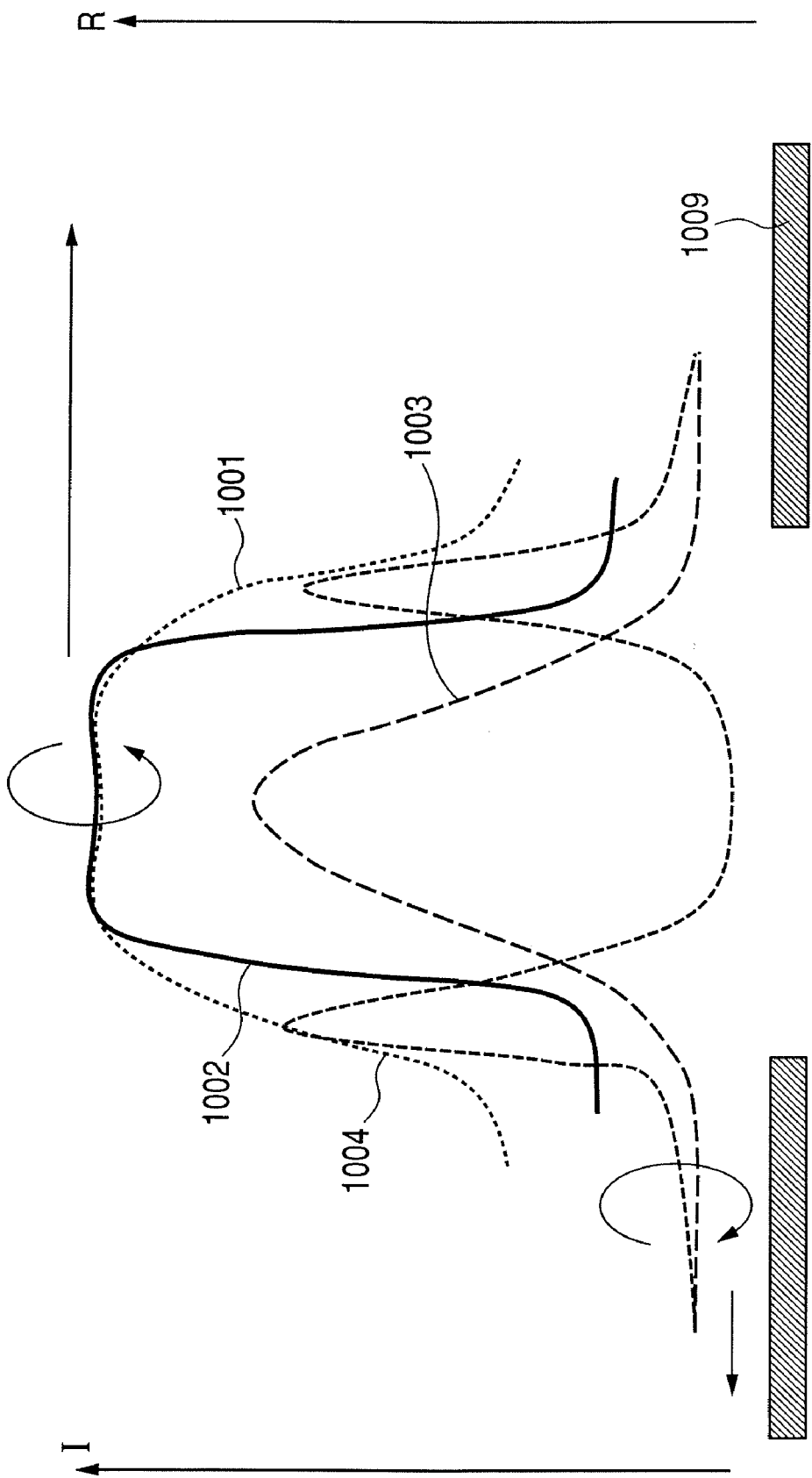
FIG. 10 is a schematic drawing showing a change of the reflectivity of the photonic crystal mirror caused by introduction of a phase-shift part, and light intensity distribution in the resonator in the vertical cavity surface emitting laser of Example 1 of the present invention.

FIG. 10 shows schematically the change of the reflectivity of the photonic crystal mirror caused by introduction of the phase-shift parts, and the light intensity distribution in the resonator of the vertical cavity surface emitting laser of this example.

In FIG. 10, the abscissa indicates the inside structure of the device, the ordinate on the right side indicates the reflectivity, and the ordinate on the left side represents the light intensity distribution in the device. In FIG. 10, the reference numerals denote the followings: 1001, the spatial distribution of the reflectivity (before introduction of the phase-shift part); 1002, the spatial distribution of the reflectivity (after introduction of the phase-shift part); 1003, the light intensity distribution of the fundamental mode (zero-order); 1004, the light intensity distribution of the higher mode (first-order); and 1009, the oxidation-formed confining layer.

The mirror reflectivity distribution curve 1001 without the phase-shift part is changed by introduction of the phase-shift part to the mirror reflectivity distribution curve 1002. The mirror of this Example has such reflectivity characteristics.

Thereby the light intensity distribution 1003 of the fundamental mode (zero-order) formed by oxidation-narrowed layer 1009 is retained but the reflectivity of the light intensity distribution 1004 of the higher mode (first-order) is lowered, whereby the probability of oscillation of a single lateral mode can be raised.

The device of this Example can be produced by a conventional process for compound semiconductor device production: the process including film-forming processes such as crystal growth, vapor deposition, and sputtering; lithography processes such as photolithography and EB lithography; etching processes such as wet-dry etching; selective etching processes; drying processes; and electrode vapor deposition-sputtering processes.

In this Example, the materials of types of GaAs and AlGaAs are used for the entire laser device, but are not limited thereto. Any of the above-mentioned materials for the mirror, the active layer, the cladding layer, and the electrode are applicable.

Any kind of the photonic crystal, any arrangement and forms of the lattice points mentioned above for this embodiment are useful.

Example 2

This Example 2 describes a constitution of another vertical cavity surface emitting laser different from that of Example 1.

Figure 11:
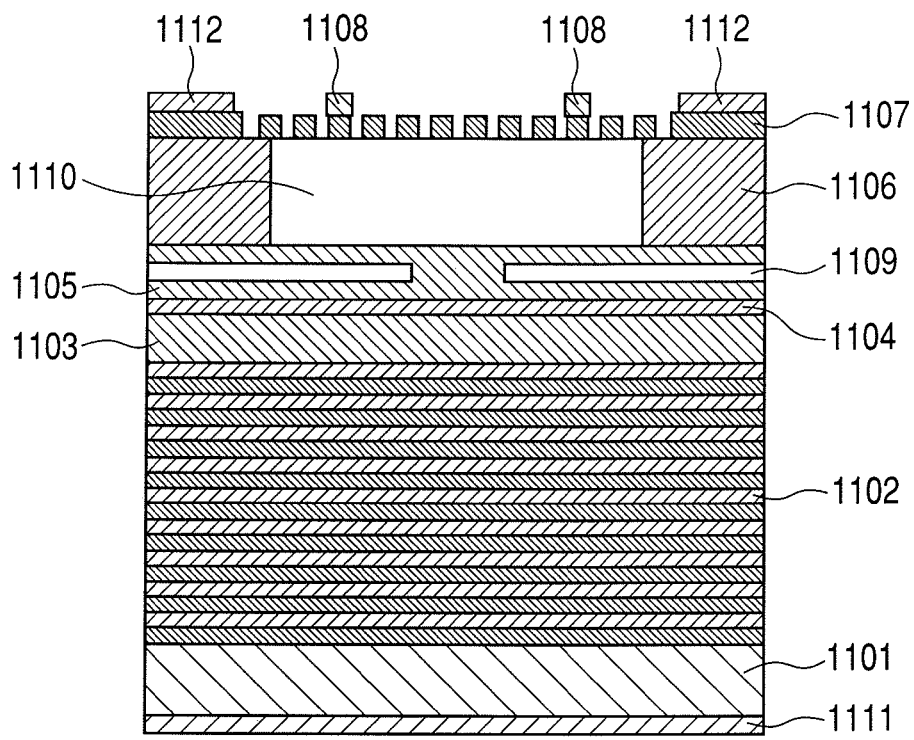
FIG. 11 is a schematic sectional view of the vertical cavity surface emitting laser of Example 2 of the present invention.

FIG. 11 illustrates a schematic sectional view of the vertical cavity surface emitting laser of this Example. In FIG. 11, the reference numerals denote the followings: 1101, a substrate; 1102, a DBS mirror; 1103, a lower cladding layer; 1104, an active layer; 1105, an upper cladding layer; 1106, an upper spacer layer; 1107, a photonic crystal mirror; 1108, a phase-shift part; 1109, an oxidation-formed confining layer; 1110, an air-bridge structure; 1111, an n-electrode; and 1112, a p-electrode.

In this Example 2, being different from Example 1, phase-shift parts 1108 are placed at the positions different from the positions in Example 1 in the photonic crystal mirror plane direction, and are formed in the adjacent layer, not within the inside of the photonic crystal layer 1107.

Specifically, phase-shift parts 1108 are placed on the positions of the mirror where the reflectivity-lowered portion on the mirror center side corresponds to the intersecting points of the light intensity distribution curves of the zero-order mode and the first-order mode, and on the non-gapped portions of the photonic crystal mirror.

The positions of introduction of the phase-shift parts are apart from the mirror center at a distance of about 3.7 μm corresponding to the intersecting points of the light intensity distribution curves of the first-order mode and second-order mode of the resonating light for the oxide aperture of 10 μm.

The photonic crystal has a size of 20 crystal periods inside the phase-shift parts and 10 crystal periods on the both sides, 30 crystal periods in total, and about 12 μm in the mirror periodic structure direction.

Other constitution, structures, and materials of the device are the same as in Example 1 illustrated in FIG. 7. In this Example, the lower two digits of the reference numerals are common with those in FIG. 7.

Figure 12:
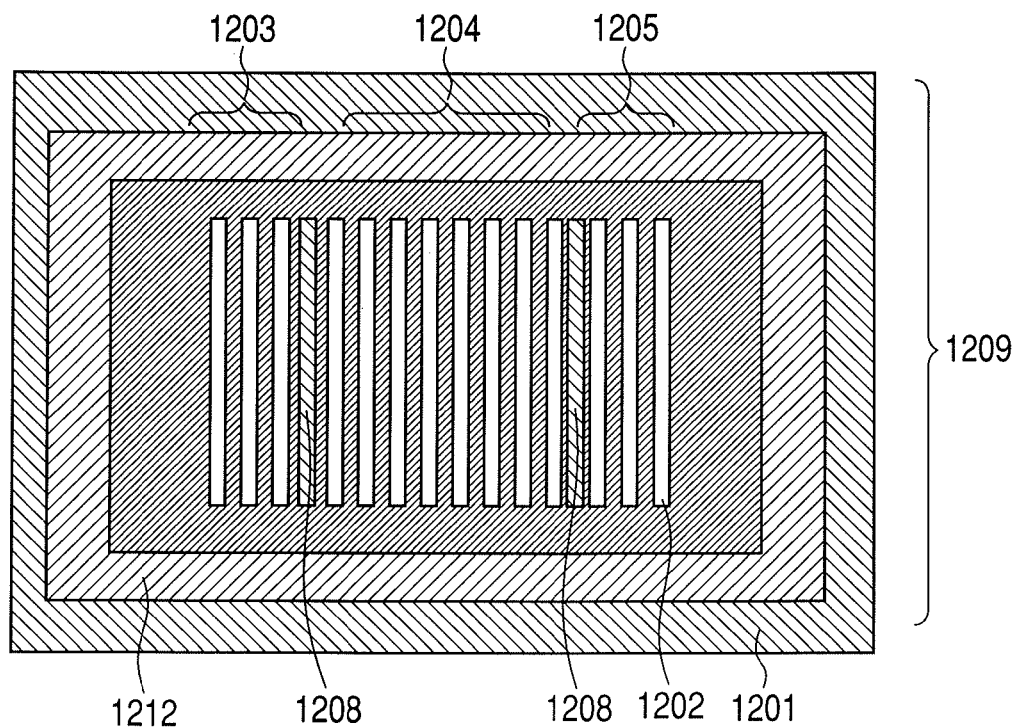
FIG. 12 is a schematic plan view of the photonic crystal mirror of the vertical cavity surface emitting laser of Example 2 of the present invention.

FIG. 12 is a plan view of the photonic crystal mirror of this Example. The mirror in FIG. 12 is different from the one in FIG. 8 only in that phase-shift parts 1208 are mounted on the photonic crystal 1201. The reference numerals in FIG. 12 correspond to those in FIG. 8 in the lower two digits.

In this Example, the phase-shift parts 1108 or 1208 mounted on the photonic crystal mirror are formed from $SiO_2$.

In this Example, the possible dimension of the phase shift is about λ/8, smaller than in Example 1, since the phase-shift part is not placed within the photonic crystal mirror plane.

Therefore, the extent of the decrease of the reflectivity is smaller, and the ratio of the decrease of the reflectivity (the spatial change of the reflectivity between the high reflectivity portion and the low reflectivity portion) is also smaller.

Figure 13:
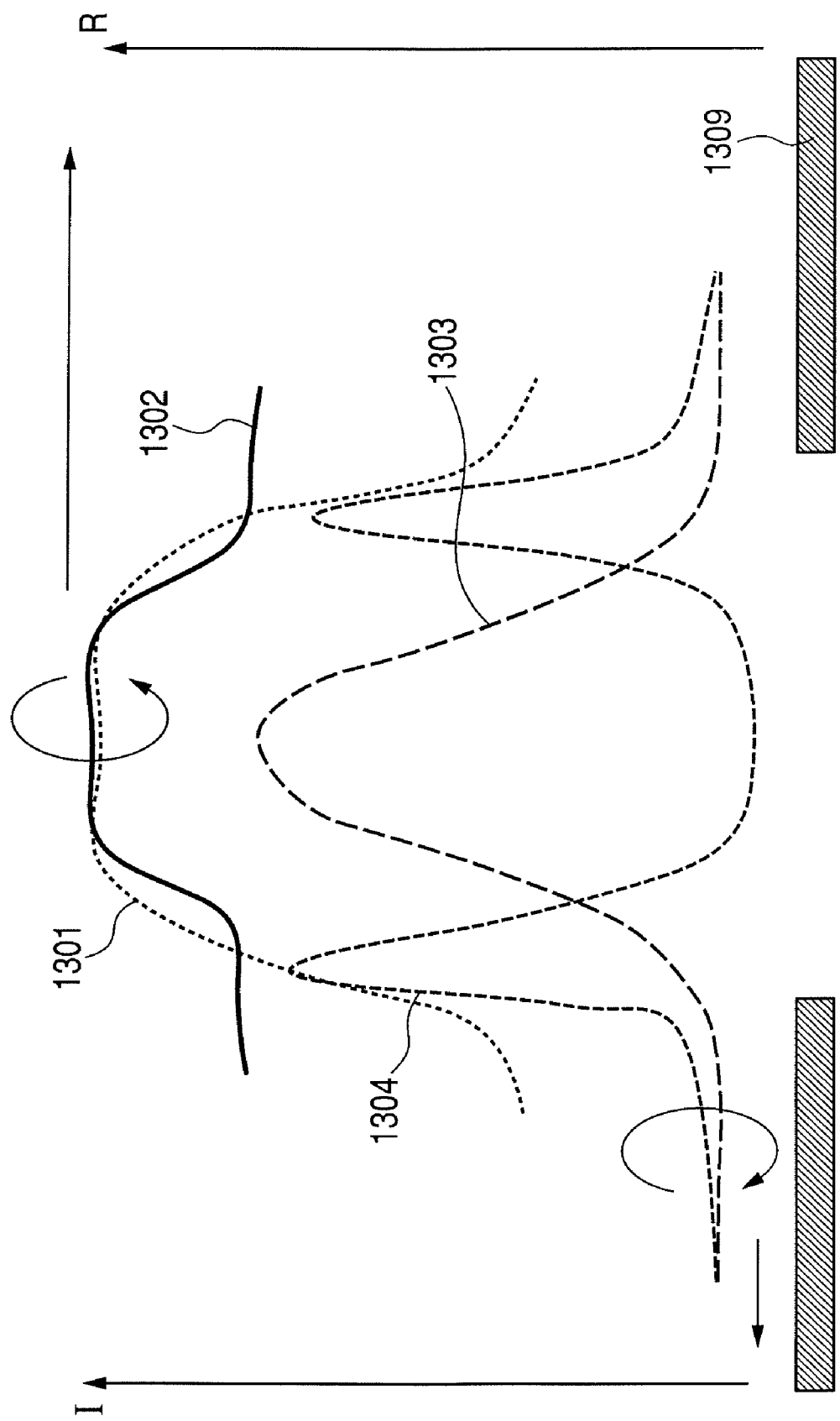
FIG. 13 is a schematic drawing showing a change of the reflectivity of the photonic crystal mirror caused by introduction of the phase-shift part, and light intensity distribution in the resonator in the vertical cavity surface emitting laser of Example 1 of the present invention.

FIG. 13 illustrates schematically the change of the reflectivity of the photonic crystal mirror by introduction of the phase-shift part and the light intensity distribution in the resonator of the vertical cavity surface emitting laser of the present invention.

In FIG. 13, the reference numerals correspond in the lower two digits to those in FIG. 10 of Example 1.

As shown in FIG. 13, reflectivity 1301 of the mirror having no phase-shift part is lower for first-order mode 1304 as shown by the numeral 1302 owing to the phase shift similarly as in Example 1.

However, owing to the lower extent of the phase shift, the extent and ratio of decrease of reflectivity 1302 are less than those of reflectivity 1002 in FIG. 10.

Therefore, the mirror of this Example is suitable for the purpose of lowering the threshold by keeping the extinction ratio to some extent and retarding the decrease of reflectivity for the fundamental mode rather than the purpose of increasing the extinction ratio of the higher mode relative to the fundamental mode.

As described in the above embodiment, when the device can be produced larger in size to decrease the influence of the process error at the end portion, the device can be useful for facilitating the process condition adjustment.

In the production of the device of this Example, the process to the step of formation of the phase-shift part is conducted in the same manner as in Example 1.

Specifically, the entire device excluding the phase-shift part and the electrodes are produced firstly, and thereafter the phase-shift part is formed by sputtering at predetermined positions.

In this sputtering, the portions other than the phase-shift parts are masked. Finally, electrodes are vapor-deposited for current injection to complete the device.

In this Example, the materials of types of GaAs and AlGaAs are used for the entire laser device, but are not limited thereto. Any of the above-mentioned materials for the mirror, the active layer, the cladding layer, and the electrode are applicable.

Any kind of the photonic crystal, any arrangement and forms of the lattice points mentioned above for this embodiment are useful.

Example 3

This Example 3 describes a constitution of a vertical cavity surface emitting laser which employs a two-dimensional photonic crystal as the photonic crystal mirror.

Figure 14:
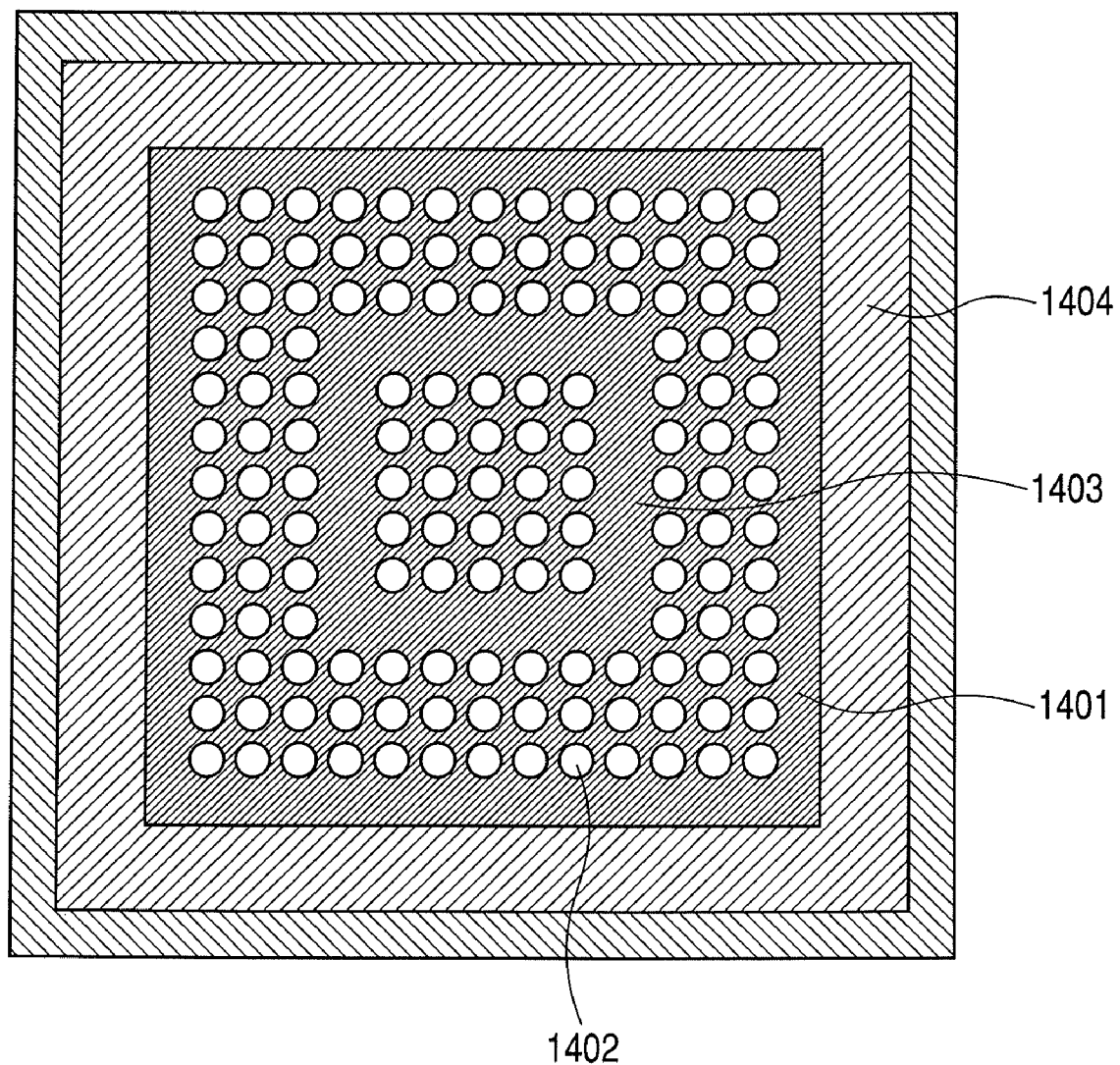
FIG. 14 is a schematic plan view of the photonic crystal mirror of the vertical cavity surface emitting laser of Example 3 of the present invention.

FIG. 14 is a schematic plan view of the photonic crystal mirror of the vertical cavity surface emitting laser in Example 3 of the present invention.

In FIG. 14, the reference numerals denote the followings: 1401, a photonic crystal layer, 1402, a hole; 1403, a phase-shift part; and 1404, a p-electrode.

In Example 3, the constitution and materials of the laser device are basically the same as those in Example 1 except that the pattern of the employed photonic crystal mirror is two-dimensional.

In this Example, as illustrated in FIG. 14, circular holes 1402 are provided periodically in photonic crystal layer 1401 to form a two-dimensional crystal of a tetragonal lattice.

The phase-shift portion is placed inside by three periods from the end of the photonic crystal region.

The photonic crystal has parameters of the lattice constant of 670 nm, the hole diameter of 220 nm, and the photonic crystal layer thickness of 230 nm.

The parameters are derived by simulation in the same manner as in Example 1.

The photonic crystal region has a side of 15.5 µm, corresponding to 22 periods of the photonic crystal.

The oxidation-formed aperture has a diameter of 10 µm as in Examples 1 and 2. However, the breadth of the reflectivity-lowered region 303 in FIG. 3A is 3.35 µm, which is larger corresponding to the size of the period. The mode distribution of the resonance light of the laser is similar to that in Example 1: the first-order mode is placed 0.23 µm to 4.33 µm apart from the device center. Therefore, the phase-shift part is introduced at the position ranging from 3.6 µm to 7.7 µm. In this Example, the phase-shift part is placed about 5.5 µm apart from the device center. Therefore, the length of the one side of the tetragonal region surrounded by the phase-shift parts is about 11 µm, 16 periods of the photonic crystal, and the size of the one side is 22 periods by totaling with the outside six periods (three periods on one side).

In this Example, use of a two-dimensional photonic crystal mirror enables control of the reflectivity distribution in two directions to heighten the effect of the mode control.

The extent of the phase shift is λ/2, which maximizes the extinctive interference. The device of this Example is produced in the same process as in Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-025995, filed Feb. 6, 2008, which is hereby incorporated by reference in its entirety.

What is claimed is:

1. A vertical cavity surface emitting laser comprising:
first and second mirrors as reflecting mirrors included in a resonator;
an active layer positioned between the first mirror and the second mirror; and
a current-confining layer for confining an electric current injected into the active layer, wherein
the first mirror includes a periodic refractive index structure in a plane direction of the mirror, and a phase-shift part, whereby a light beam introduced perpendicularly to a mirror plane resonating in the plane direction of the mirror and is reflected in a direction perpendicular to the plane direction of the mirror,
a reflectivity of a specific resonant mode in a neighboring region to the phase-shift part is lower than a reflectivity in regions other than the neighboring region,
the periodic refractive index structure has a one-dimensional periodic structure in which a refractive index changes periodically in one direction in the mirror plane,
the one-dimensional periodic structure is a one-dimensional photonic crystal, and therein two or more phase-shift portions are provided at positions where light in the plane direction of the mirror that passes through each phase-shift portion does not interfere,
the current-confining layer is an oxidation aperture with a diameter in a range of from 5 to 8 µm, and
the phase-shift part is positioned outside the oxidation aperture.

2. The vertical cavity surface light emitting laser according to claim 1, wherein the specific resonant mode is formed by the current-confining layer.

3. The vertical cavity surface light emitting laser according to claim 1, wherein the neighboring region covers 4 to 10 periods of the periodic refractive index structure from the phase shift part.

4. The vertical cavity surface emitting laser according to claim 1, wherein the neighboring region covers 4 to 5 periods of the photonic crystal from the phase-shift part.

5. A vertical cavity surface emitting laser comprising:
first and second mirrors as reflecting mirrors included in a resonator;
an active layer positioned between the first mirror and the second mirror; and
a current-confining layer for confining an electric current injected into the active layer, wherein
the first mirror includes a periodic refractive index structure in a plane direction of the mirror, and a phase-shift part, whereby a light beam introduced perpendicularly to a mirror plane resonating in the plane direction of the mirror and is reflected in a direction perpendicular to the plane direction of the mirror,
a reflectivity of a specific resonant mode in a neighboring region to the phase-shift part is lower than a reflectivity in regions other than the neighboring region,
the periodic refractive index structure has a one-dimensional periodic structure in which a refractive index changes periodically in one direction in the mirror plane,
the one-dimensional periodic structure is a one-dimensional photonic crystal, and therein two or more phase-shift portions are provided at positions where light in the plane direction of the mirror passes through each phase-shift portion does not interfere, and a gap is provided between the first mirror and the second mirror, the gap being adjacent to an upper one of the first and second mirror.

6. The vertical cavity surface light emitting laser according to claim 5, wherein the specific resonant mode is formed by the current-confining layer.

7. The vertical cavity surface light emitting laser according to claim 5, wherein the neighboring region covers 4 to 10 periods of the periodic refractive index structure from the phase shift part.

8. The vertical cavity surface emitting laser according to claim 5, wherein the neighboring region covers 4 to 5 periods of the photonic crystal from the phase-shift part.

* * * * *